United States Patent
Lee et al.

(10) Patent No.: US 10,383,218 B2
(45) Date of Patent: Aug. 13, 2019

(54) DRIVING ASSEMBLY TO CURVE DISPLAY MODULE AND DISPLAY DEVICE INCLUDING THE SAME

(71) Applicant: Samsung Display Co., Ltd., Yongin-si, Gyeonggi-do (KR)

(72) Inventors: Jaesang Lee, Asan-si (KR); Sojeong La, Suwon-si (KR); Luly Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 277 days.

(21) Appl. No.: 15/046,692

(22) Filed: Feb. 18, 2016

(65) Prior Publication Data

US 2017/0013733 A1 Jan. 12, 2017

(30) Foreign Application Priority Data

Jul. 6, 2015 (KR) ........................ 10-2015-0095975

(51) Int. Cl.
*H05K 1/02* (2006.01)
*G02F 1/13* (2006.01)
*G02F 1/1333* (2006.01)

(52) U.S. Cl.
CPC ....... *H05K 1/028* (2013.01); *G02F 1/133305* (2013.01); *G02F 1/133308* (2013.01); *G02F 2001/133322* (2013.01)

(58) Field of Classification Search
CPC .............. H05K 1/028; G02F 1/133305; G02F 1/133308; G02F 2001/133322
USPC ............................................ 361/749, 679.27
See application file for complete search history.

(56) References Cited

U.S. PATENT DOCUMENTS

| | | |
|---|---|---|
| 2009/0256907 A1 | 10/2009 | Faragher |
| 2010/0097383 A1 | 4/2010 | Nystad et al. |
| 2010/0318403 A1 | 12/2010 | Bottom |
| 2011/0019351 A1* | 1/2011 | Bayne .............. G02F 1/133308 361/679.01 |
| 2011/0300937 A1 | 12/2011 | Crowder, Jr. et al. |
| 2011/0310477 A1 | 12/2011 | Ishibashi |
| 2012/0044618 A1 | 2/2012 | Lee |
| 2012/0081874 A1 | 4/2012 | Wu et al. |
| 2012/0274575 A1 | 11/2012 | Solomon et al. |
| 2014/0247566 A1 | 9/2014 | Lee et al. |
| 2014/0354519 A1 | 12/2014 | Lee et al. |

(Continued)

FOREIGN PATENT DOCUMENTS

| | | |
|---|---|---|
| KR | 1020140033486 A | 3/2014 |
| KR | 1020140139950 A | 12/2014 |
| KR | 1020150018339 A | 2/2015 |

*Primary Examiner* — Michael P McFadden
(74) *Attorney, Agent, or Firm* — Cantor Colburn LLP (57) ABSTRACT

A display device includes: a display module including a display panel which displays an image; a main driving unit on a side of the display module; a first auxiliary driving assembly hinge-connected to a first side of the main driving unit; and a second auxiliary driving assembly hinge-connected to a second side of the main driving unit opposite to the first side thereof. The main driving unit includes: a fixing bracket attached to the side of the display module; a first main actuator hinge-connected to a first side of the fixing bracket; and a second main actuator hinge-connected to a second side of the fixing bracket opposite to the first side thereof.

19 Claims, 9 Drawing Sheets

(56) References Cited

U.S. PATENT DOCUMENTS

| | | | |
|---|---|---|---|
| 2015/0043136 A1* | 2/2015 | Kim | G02F 1/133305 |
| | | | 361/679.01 |
| 2015/0092361 A1* | 4/2015 | Cho | H02K 7/00 |
| | | | 361/749 |

* cited by examiner

DRIVING ASSEMBLY TO CURVE DISPLAY MODULE AND DISPLAY DEVICE INCLUDING THE SAME

This application claims priority to Korean Patent Application No. 10-2015-0095975, filed on Jul. 6, 2015, and all the benefits accruing therefrom under 35 U.S.C. § 119, the content of which in its entirety is herein incorporated by reference.

BACKGROUND

1. Field

Exemplary embodiments of the invention relate to a display device, and more particularly, to a display device for which various curvatures are formable along a surface of a display module of the display device.

2. Description of the Related Art

Display devices are classified into types including liquid crystal display ("LCD") devices, organic light emitting diode ("OLED") display devices, plasma display panel ("PDP") devices, electrophoretic display ("EPD") devices, and the like, based on a light emitting scheme thereof.

Trends in research on display devices exhibit a movement away from conventional flat display devices to curved display devices. Curved display devices may provide a three-dimensional ("3D") effect such as, for example, 3D images, to a user. In addition, demands for curved display devices are growing due to capability thereof for increasing user immersion.

However, there are cases in which flat display devices are preferred as compared to curved display devices. Moreover, even with a curved display device, a viewing angle thereof may be limited based on a position of the user with respect to the curved display device such as when there is more than one user.

Accordingly, there remains a need for varying curvatures of a display module of a display device in various manners based on circumstances of the user.

SUMMARY

One or more exemplary embodiments of the invention are directed to a display device for which various curvatures are formable along a surface of a display module of the display device.

According to an exemplary embodiment of the invention, a display device includes: a display module including a display panel which displays an image; a main driving unit on a side of the display module; a first auxiliary driving assembly hinge-connected to a first side of the main driving unit; and a second auxiliary driving assembly hinge-connected to a second side of the main driving unit opposite to the first side thereof. The main driving unit includes: a fixing bracket attached to the side of the display module; a first main actuator hinge-connected to a first side of the fixing bracket; and a second main actuator hinge-connected to a second side of the fixing bracket opposite to the first side thereof.

The first auxiliary driving assembly may be fixed to the side of the display module and include a first auxiliary driving unit provided in plural arranged in a row in a first direction from the main driving unit and hinge-connected to each other, and the second auxiliary driving assembly may be fixed to the side of the display module and include a second auxiliary driving unit provided in plural arranged in a row in a second direction from the main driving unit opposite to the first direction and hinge-connected to each other.

The first auxiliary driving unit may include: a first link portion defining first, second and third joints thereof spaced apart from one another; and a first auxiliary actuator hinge-connected to the first link portion.

For the hinge-connection between the first auxiliary driving assembly and the main driving unit, the fixing bracket may be connected to the first joint, and the first main actuator may be connected to the second joint.

The second joint may pivotably move about the first joint based on a driving state of the first main actuator.

The second joint may move along an arc-shaped trajectory defined about the first joint.

The second auxiliary driving unit may include: a second link portion defining fourth to sixth joints thereof spaced apart from one another; and a second auxiliary actuator hinge-connected to the second link portion.

For the hinge-connection between the second auxiliary driving assembly and the main driving unit, the fixing bracket may be connected to the fourth joint, and the second main actuator may be connected to the fifth joint.

The fifth joint may pivotably move about the fourth joint based on a driving state of the second main actuator.

The fifth joint may move along an arc-shaped trajectory defined about the fourth joint.

Among two adjacent first auxiliary driving units of the first auxiliary driving assembly which are hinge-connected to each other, the first joint of one first auxiliary driving unit may be connected to the third joint of the other first auxiliary driving unit, and the second joint of the one first auxiliary driving unit may be connected to the first auxiliary actuator of the other first auxiliary driving unit.

For the two adjacent first auxiliary driving units hinge-connected to each other, the second joint may pivotably move along an arc-shaped trajectory about the first joint.

Among two adjacent second auxiliary driving units of the second auxiliary driving assembly which are hinge-connected to each other, the fourth joint of one second auxiliary driving unit may be connected to the sixth joint of the other second auxiliary driving unit, and the fifth joint of the one second auxiliary driving unit may be connected to the second auxiliary actuator of the other second auxiliary driving unit.

For the two adjacent second auxiliary driving units hinge-connected to each other, the fifth joint may pivotably move along an arc-shaped trajectory about the fourth joint.

The first main actuator and the second main actuator hinge-connected to opposing sides of the fixing bracket may intersect one another.

The first link portion and the second link portion may be fixed to the display module using an adhesive member.

The adhesive member may be an elastomer.

The adhesive member may be one selected from a styrene-based polymer, a polyurethane-based polymer, an amide-based polymer, a polyethylene terephthalate-based polymer, and a combination thereof.

The foregoing is illustrative only and is not intended to be in any way limiting. In addition to the illustrative embodiments and features described above, further embodiments and features will become apparent by reference to the drawings and the following detailed description.

BRIEF DESCRIPTION OF THE DRAWINGS

The above and other features of the present disclosure of the invention will be more clearly understood from the following detailed description taken in conjunction with the accompanying drawings, in which.

DETAILED DESCRIPTION

Exemplary embodiments will now be described more fully hereinafter with reference to the accompanying drawings. Although the invention can be modified in various manners and have several embodiments, exemplary embodiments are illustrated in the accompanying drawings and will be mainly described in the specification. However, the scope of the invention is not limited to the exemplary embodiments and should be construed as including all the changes, equivalents, and substitutions included in the spirit and scope of the invention.

In the drawings, certain elements or shapes may be simplified or exaggerated to better illustrate the invention, and other elements present in an actual product may also be omitted. Thus, the drawings are intended to facilitate the understanding of the invention. Like reference numerals refer to like elements throughout the specification.

Throughout the specification, when an element is referred to as being "connected" to another element, the element is "physically connected" to the other element or "electrically connected" to the other element with one or more intervening elements interposed therebetween.

As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second" and the like, may be used herein to describe various elements, components, areas, layers and/or sections, these elements, components, areas, layers and/or sections should not be limited by these terms. These terms are only used to distinguish one element, component, area, layer or section from another element, component, area, layer or section. Thus, a first element, component, area, layer or section discussed below could be termed a second element, component, area, layer or section without departing from the teachings of exemplary embodiments.

When a layer or element is referred to as being "connected" or "on" another layer or element, the layer or element may be directly connected or on the other layer or element, or one or more intervening layers or elements may be interposed therebetween. In contrast, when an element is referred to as being "directly connected" or "directly on" another element, there are no intervening elements present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, an exemplary embodiment of a display device 10 according to the invention will be described with reference to accompanying drawings.

Figure 1:
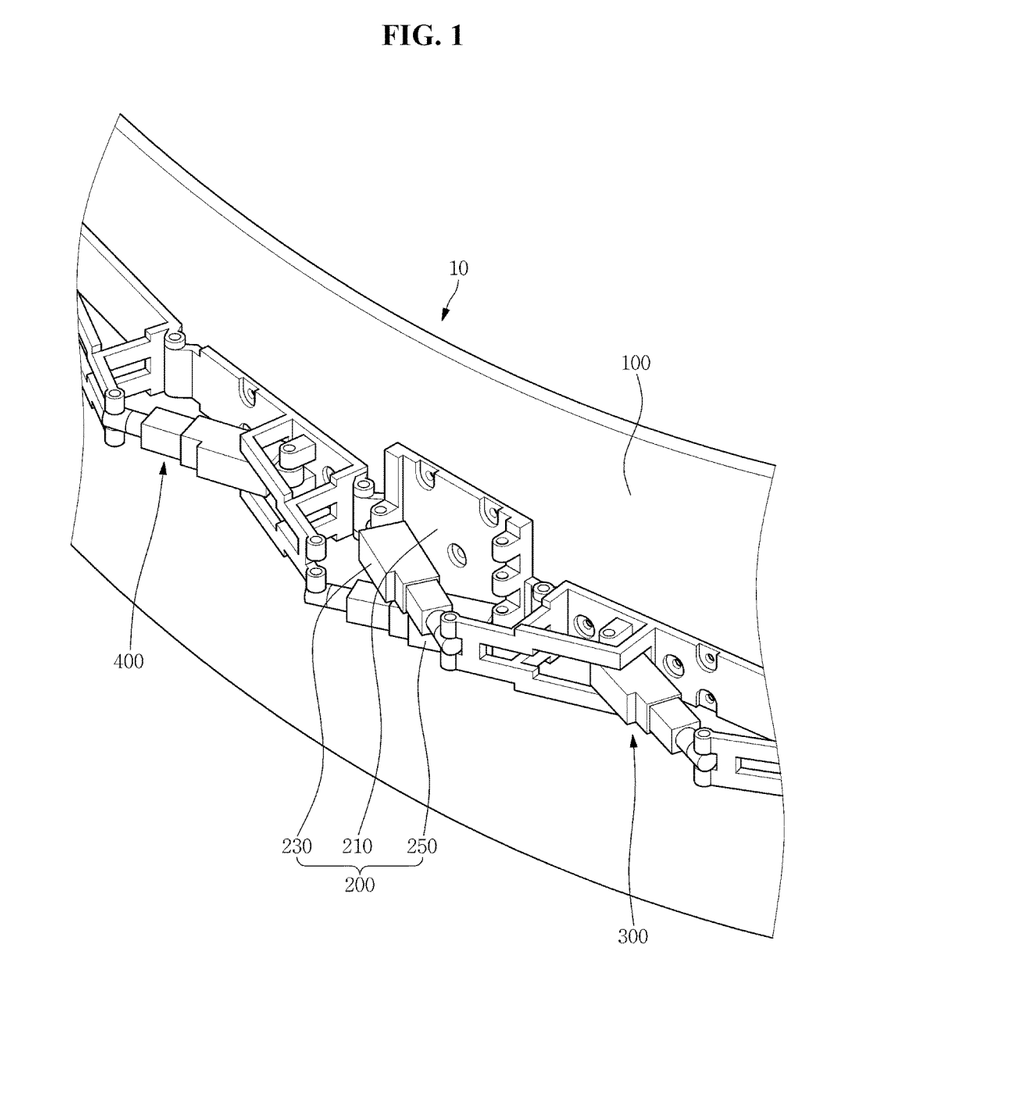
FIG. 1 is an enlarged perspective view illustrating an exemplary embodiment of a display device according to the invention.
Figure 2:
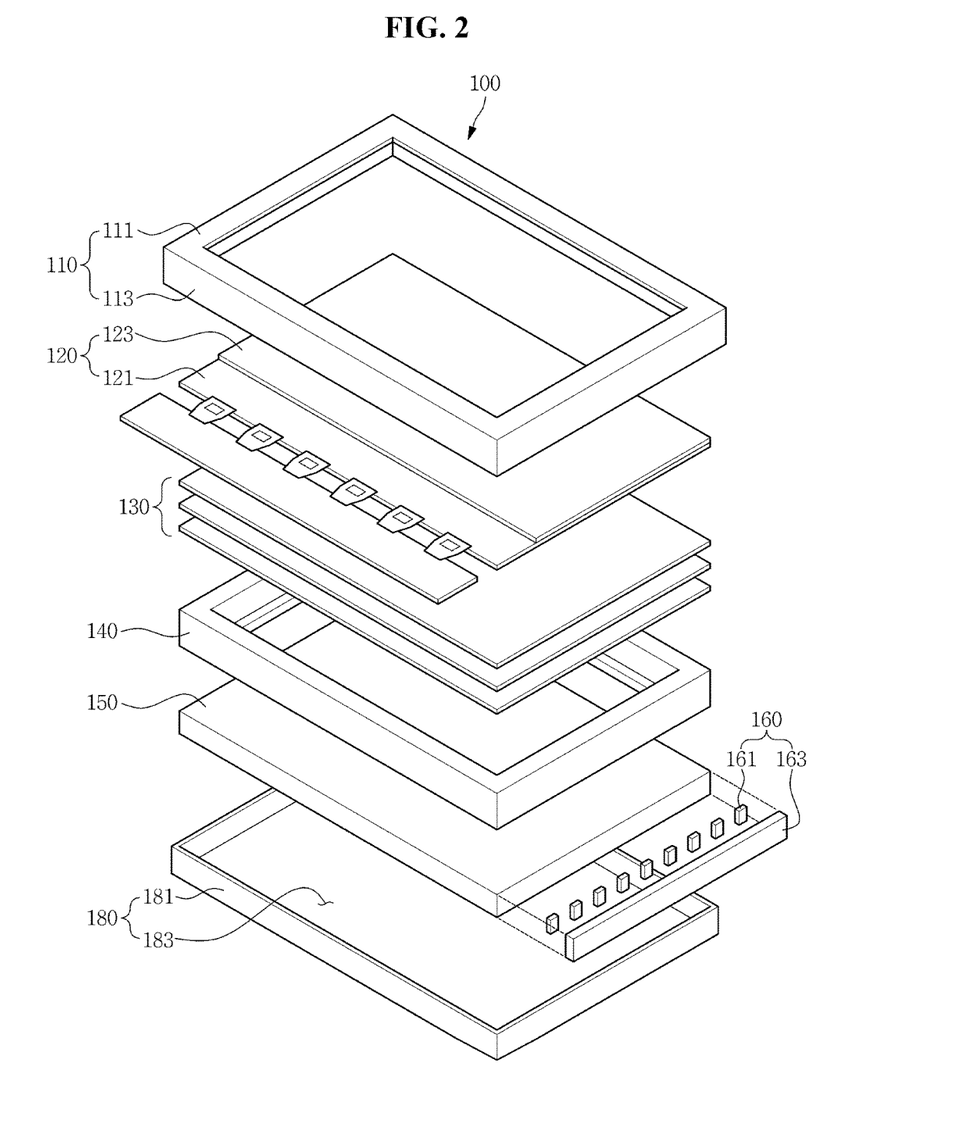
FIG. 2 is an exploded perspective view illustrating an exemplary embodiment of a display module of the display device of FIG. 1.
Figure 3:
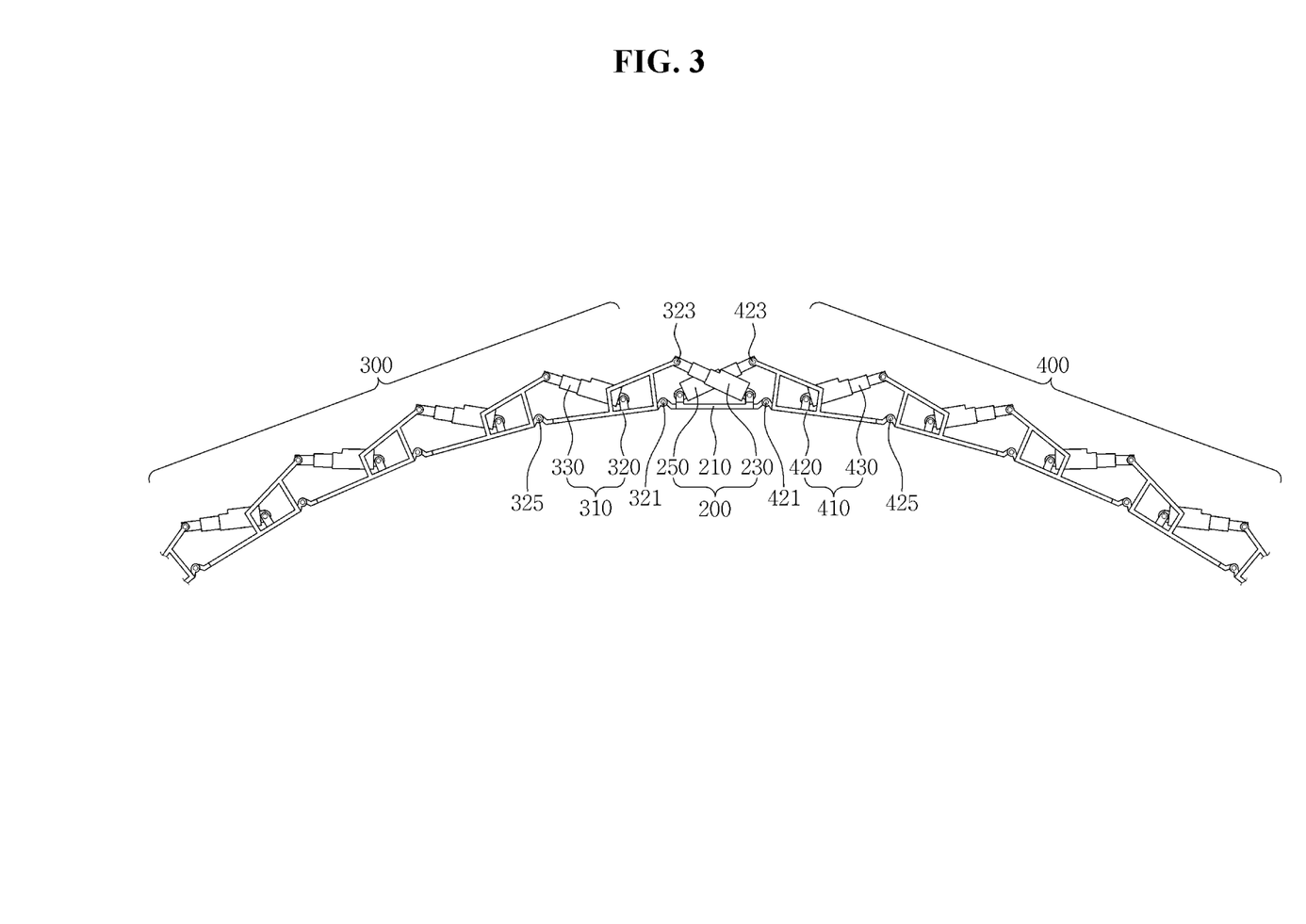
FIG. 3 is a view illustrating an exemplary embodiment of a main driving unit and first and second auxiliary driving assemblies of the display device of FIG. 1.

FIG. 1 is an enlarged perspective view illustrating an exemplary embodiment of the display device 10 according to the invention. FIG. 2 is an exploded perspective view illustrating an exemplary embodiment of a display module of the display device of FIG. 1. FIG. 3 is a view illustrating an exemplary embodiment of a main driving unit and first and second auxiliary driving assemblies of the display device of FIG. 1. FIG. 3 may represent a cross-sectional or top plan view of the display device 10.

Referring to FIGS. 1, 2 and 3, an exemplary embodiment of the display device 10 according to the invention includes a display module 100, a main driving unit 200 disposed on a side of the display module 100, a first auxiliary driving assembly 300 connected to a first side of the main driving unit 200, and a second auxiliary driving assembly 400 connected to a second side of the main driving unit 200 opposite to the first side thereof.

The display module 100 includes an upper case 110, a display panel 120, an optical sheet 130, an intermediate case 140, a light guide plate 150, a light source module 160 and a lower case 180.

An opening may be defined in the upper case 110, and an active (display) area of the display panel 120 is exposed outwardly through the opening. The upper case 110 may be disposed to cover an upper edge (e.g., a top edge) and a side surface of the display panel 120.

The upper case 110 may include a bezel portion 111 covering the upper edge of the display panel 120, and may include a side wall portion 113 bent downwardly from the bezel portion 111 to cover the side surface of the display panel 120. The upper case 110 may define the bezel portion 111 thereof and the side wall portion 113 thereof.

The display panel 120 may have a quadrangular planar shape and displays an image using light from a light source. The display panel 120 may include a first display substrate 121, a second display substrate 123 disposed to oppose the first display substrate 121, and a liquid crystal layer (not illustrated) disposed between the first and second display substrates 121 and 123.

The first display substrate 121 may include a plurality of pixel electrodes arranged substantially in a matrix form, a thin film transistor that respectively applies a driving voltage to the pixel electrodes, and various signal wirings for driving the pixel electrode and the thin film transistor, on a first base substrate.

The second display substrate 123 may be disposed to oppose the first display substrate 121, and may include a color filter, and a common electrode including or formed of a transparent conductive material, on a second base substrate. The color filter may include red, green and blue color filters, for example, but not being limited thereto.

The liquid crystal layer (not illustrated) may be interposed between the first and second display substrates 121 and 123, and may be rearranged by an electric field formed between the pixel electrode and the common electrode.

The optical sheet 130 is disposed below the display panel 120, and diffuses or collimates light transmitted from the light guide plate 150 which is to be described below. The optical sheet 130 collectively includes a diffusion sheet, a prism sheet and a protective sheet. In one exemplary embodiment, for example, the optical sheet 130 may include three layers as shown in FIG. 2, but not being limited thereto. In an alternative exemplary embodiment, the number of the layers of the optical sheet 130 may be two, four or more.

The diffusion sheet may diffuse light incident thereon from the light guide plate 150 to thereby reduce or effectively prevent the light from being partially concentrated.

In an exemplary embodiment, the prism sheet may include trigonal prisms arranged on a surface thereof in a predetermined manner. In such an embodiment, the prism sheet may be disposed on the diffusion sheet to collimate the light diffused from the diffusion sheet on to the display panel 120 in a direction substantially perpendicular to the display panel 120.

The protective sheet may be disposed on the prism sheet, may protect a surface of the prism sheet, and may diffuse light to achieve a uniform distribution of light.

In an exemplary embodiment, the intermediate case 140 may have a quadrangular shape, and may have an opening defined therein. In such an embodiment, the intermediate case 140 may have a quadrangular loop shape. The intermediate case 140 may accommodate the display panel 120, the optical sheet 130, the light guide plate 150, and the like, which are supported therein or thereon. In one exemplary embodiment, for example, the intermediate case 140 may be provided as a single unit such as being integrally formed as a single unitary and indivisible unit, as illustrated in FIG. 2. In an alternative exemplary embodiment, the intermediate case 140 may include a plurality of separate portions which are assembled to form the intermediate case 140.

The light guide plate 150 is accommodated in a space defined by the lower case 180 therebelow and the intermediate case 140 thereabove, and is supported by the lower case 180 and/or the intermediate case 140. In such an embodiment, the light guide plate 150 may have a side surface facing the light source module 160 which will be described later in detail. The light guide plate 150 may have a quadrangular planar shape, however, the shape of the light guide plate 150 is not limited thereto. According to exemplary embodiments, the light guide plate 150 may have various shapes defined therein or thereon including, for example, a predetermined groove or protrusion, based on a position of the light source module 160. The light guide plate 150 may uniformly supply light generated by a light source 161 of the light source module 160 to the display panel 120.

The lower case 180 includes a bottom portion 183 and a side portion 181. The lower case 180 may define the bottom portion 183 thereof and the side portion 181 thereof. The bottom portion 183 may have a flat surface, and the side portion 181 is connected to an edge of the bottom portion 183. In an exemplary embodiment, the side portion 181 is bent from the edge of the bottom portion 183 in a direction, for example, an upward direction in FIG. 2. In such an embodiment, the side portion 181 may be substantially perpendicular to the bottom portion 183. Accordingly, an accommodation space may be defined by the bottom portion 183 and the side portion 181 of the lower case 180.

The lower case 180 may include or be formed of a metal having relatively high rigidity such as stainless steel, or a material having high heat dissipation properties such as aluminum (Al) or an Al alloy. The lower case 180 may maintain an overall framework of the display device 100, and may protect various components accommodated therein.

The light source module 160 may be interposed between the side portion 181 of the lower case 180 and the side surface of the light guide plate 150. In such an embodiment, the light source module 160 may include a circuit board 163 and the light source 161.

The circuit board 163 has a rectangular planar shape, and is interposed between the side portion 181 of the lower case 180 and the side surface of the light guide plate 150. Accordingly, the circuit board 163 faces at least the side surface of the light guide plate 150. The circuit board 163 may be a printed circuit board ("PCB") or a metal printed circuit board ("MPCB"), for example.

The light source 161 is disposed on the circuit board 163. The light source 161 generates and emits light toward the light guide plate 150. The light source 161 may include a light emitting diode ("LED") chip (not illustrated) and a package (not illustrated) which accommodates the LED chip therein. In an exemplary embodiment, for example, the LED chip may be a gallium nitride (GaN)-based LED chip which emits blue light.

In the foregoing, an exemplary embodiment of the display module 100 including a liquid crystal display ("LCD") panel has been described. However, the display module 100 is not limited thereto. In an alternative exemplary embodiment, the display module 100 may include a display panel using an organic light emitting diode ("OLED").

The main driving unit 200 of the display device 10 includes a fixing bracket 210, a first main actuator 230 that is hinge-connected to a first side of the fixing bracket 210, and a second main actuator 250 that is hinge-connected to a second side of the fixing bracket 210 opposite to the first side thereof.

The fixing bracket 210 is disposed on a rear surface of the display module 100. In an exemplary embodiment, the fixing bracket 210 may have a quadrangular planar shape. Accordingly, the fixing bracket 210 may be closely attached to a portion of the rear surface of the display module 100 that has a planar area. In particular, the fixing bracket 210 may be attached at a center of the display module 100 taken in a horizontal direction. The position of the fixing bracket 210 is a reference point for determining a curvature of the display module 100.

The fixing bracket 210 may be fixed to the display module 100 through screw-coupling but is not limited thereto. In addition or alternative, the fixing bracket 210 may be fixed to the display module 100 using an adhesive member.

The first main actuator 230 is connected to the fixing bracket 210. In detail, a first end of the first main actuator 230 is connected to the first side of the fixing bracket 210. A second end of the first main actuator 230 opposite to the first end thereof is connected to the first auxiliary driving assembly 300 which will be described later in detail.

The second main actuator 250 is hinge-connected to the fixing bracket 210. In detail, a second end of the second main actuator 250 is connected to the second side the fixing bracket 210, and a first end of the second main actuator 250 opposite to the first end thereof is connected to the second auxiliary driving assembly 400.

The first main actuator 230 and the second main actuator 250 intersect one another. That is, in a top plan view shown in FIG. 3, the first main actuator 230 and the second main actuator 250 overlap one another. In this regard, where the display module 100 is curved to have a predetermined curvature, stress that may occur due to the fixing of the display module 100 and the fixing bracket 210 may be significantly reduced.

Referring to FIG. 3, the first auxiliary driving assembly 300 includes a first auxiliary driving unit 310 provided in plural. The first auxiliary driving units 310 are arranged in a row in a direction from the main driving unit 200 to a one distal end of the display module 100. In such an embodiment, the first auxiliary driving unit 310 includes a first link portion 320 and a first auxiliary actuator 330 that is hinge-connected to a side of the first link portion 320.

The first link portion 320 may be a bar or a plate having a predetermined length. The first link portion 320 includes first, second and third joints 321, 323 and 325. The first link portion 320 may define the first, second and third joints 321, 323 and 325 thereof.

The first joint 321 is disposed at one end of the first link portion 320, and the third joint 325 is disposed at an opposing end of the first link portion 320. In addition, the second joint 323 is disposed to be spaced apart from the first joint 321 at a predetermined distance. In other words, the second joint 323 may extend from the first joint 321 to have a predetermined distance therefrom. The distance may be defined along a length of the curvature of the display module 100 and/or a distance normal to the curvature of the display module 100. The first, second and third joints 321, 323 and 325 are configured to hinge-connect the first link portion 320 and components of the display device 10 to one another which will be described later.

The first auxiliary actuator 330 may be disposed between the first joint 321 and the third joint 325.

The first link portion 320 is disposed on the rear surface of the display module 100 (not shown in FIG. 3 for convenience of illustration). In an exemplary embodiment, the first link portion 320 is attached to the display module 100 through screw-coupling, rivet-coupling or the like.

In an alternative exemplary embodiment, the first link portion 320 may be attached to the display module 100 using an adhesive member. In such an embodiment, the adhesive member may be an elastomer.

In detail, the adhesive member may be one selected from a styrene-based polymer, a polyurethane-based polymer, an amide-based polymer, a polyethylene terephthalate-based polymer, and a combination thereof.

The adhesive member, which is an elastomer, may be deformed from an initial length thereof such as being elongated when being pulled by an external force, and may retract to the initial length thereof when removing the external force. Accordingly, where the display module 100 to which the plurality of first link portions 320 are attached is bent, stress that may be developed in the display module 100 due to a difference among respective moduli of strain of the plurality of first link portions 320 may be mitigated through the use of the adhesive member which is an elastomer.

The second auxiliary driving assembly 400 includes a second auxiliary driving unit 410 provided in plural. The second auxiliary driving units 410 are arranged in a row in a direction from the main driving unit 200 to an opposing distal end of the display module 100 opposite to the one distal end thereof. In such an embodiment, the second auxiliary driving unit 410 includes a second link portion 420 and a second auxiliary actuator 430 that is hinge-connected to a side of the second link portion 420.

The second link portion 420 may be a bar or a plate having a predetermined length. The second link portion 420 includes fourth, fifth and sixth joints 421, 423 and 425. The second link portion 420 may define the fourth, fifth and sixth joints 421, 423 and 425.

The fourth joint 421 is disposed at one end of the second link portion 420. The sixth joint 425 is disposed an opposing end of the second link portion 420. In addition, the fifth joint 423 is disposed to be spaced apart from the fourth joint 421 by a predetermined distance. In other words, the fifth joint 423 may extend from the fourth joint 421 to have a predetermined distance therefrom. Again, the distance may be defined along a length of the curvature of the display module 100 and/or a distance normal to the curvature of the display module 100. The fourth, fifth and sixth joints 421, 423 and 425 are configured to hinge-connect the second link portion 420 and components of the display device 10 to one another which will be described later.

The second auxiliary actuator 430 may be disposed between the fourth joint 421 and the sixth joint 425.

In an exemplary embodiment, similar to the first link portion 320, the second link portion 420 may be attached to the display module 100 through screw-coupling, rivet-coupling, or the like.

In an alternative exemplary embodiment, similar to the first link portion 320, the second link portion 420 may be attached to the display module 100 using an adhesive member. In such an embodiment, the adhesive member may be an elastomer, and may be one selected from a styrene-based polymer, a polyurethane-based polymer, an amide-based polymer, a polyethylene terephthalate-based polymer, and a combination thereof.

Where the display module 100 to which the plurality of second link portions 420 are attached is bent, stress that may be developed in the display module 100 due to a difference among respective moduli of strain of the plurality of second link portions 420 may be mitigated through the use of the adhesive member which is an elastomer.

Figure 4A:
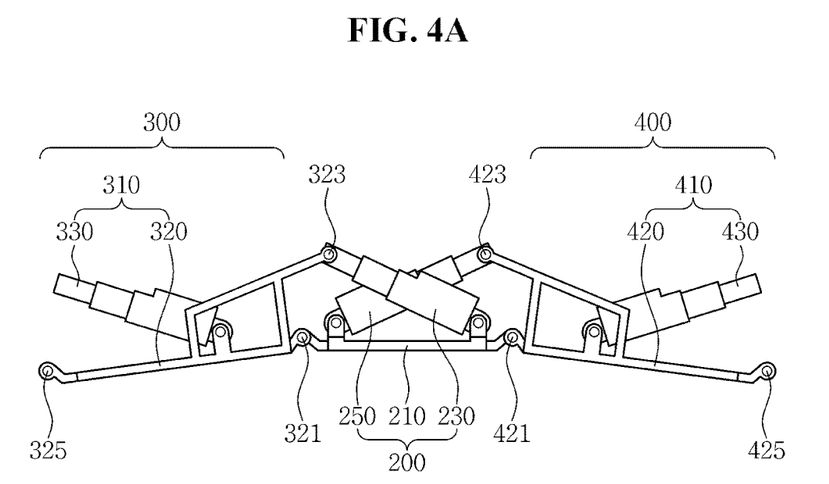
FIG. 4A is a view illustrating an exemplary embodiment of a connection mechanism between the main driving unit and the first and second auxiliary driving assemblies of FIG. 3.

FIG. 4A is a view illustrating an exemplary embodiment of a connection mechanism between the main driving unit 200 and the first and second auxiliary driving assemblies 300 and 400 of FIG. 3.

Referring to FIG. 4A, the first auxiliary driving assembly 300 is connected to a side of the main driving unit 200. In detail, the fixing bracket 210 of the main driving unit 200 is hinge-connected to the first joint 321 of the first link portion 320. In addition, the first main actuator 230 of the main driving unit 200 is hinge-connected to the second joint 323 of the first link portion 320.

The second auxiliary driving assembly 400 is connected to an opposing side of the main driving unit 200. In detail, the fixing bracket 210 of the main driving unit 200 is hinge-connected to the fourth joint 421 of the second link portion 420. In addition, the second main actuator 250 of the main driving unit 200 is hinge-connected to the fifth joint 423 of the second link portion 420.

Figure 4B:
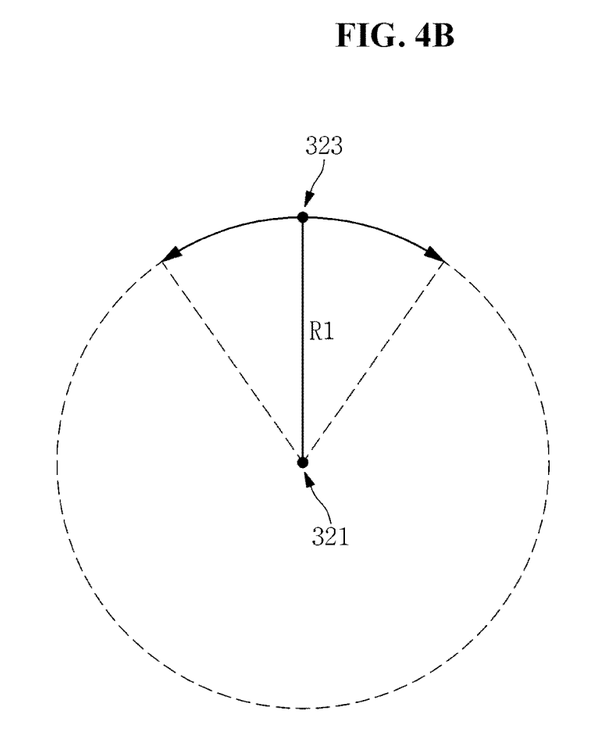
FIG. 4B is a view illustrating an exemplary embodiment of a movement of a second joint within the connection mechanism of FIG. 4A.
Figure 4C:
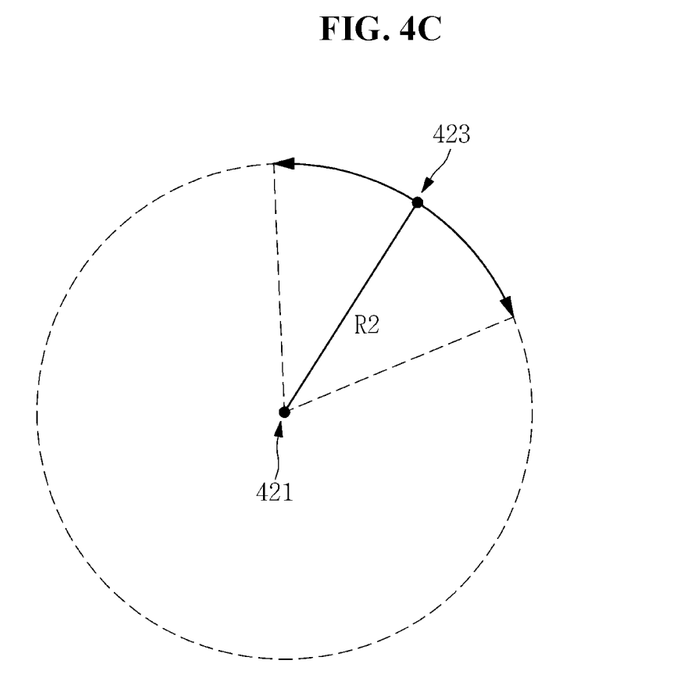
FIG. 4C is a view illustrating an exemplary embodiment of a movement of a fifth joint within the connection mechanism of FIG. 4A.

A description of a movement of the second joint 323 of the first link portion 320 and the fifth joint 423 of the second link portion 420 will be provided with reference to FIGS. 4B and 4C. FIG. 4B is a view illustrating an exemplary embodiment of a movement of the second joint 323 of the first link portion 320 of FIG. 4A. FIG. 4C is a view illustrating a movement of the fifth joint 423 of the second link portion 420 of FIG. 4A.

Referring to FIG. 4B, for the main driving unit 200 hinge-connected to the first auxiliary driving assembly 300, the second joint 323 of the first link portion 320 moves about the first joint 321 as a pivot based on the driving of the first main actuator 230 of the main driving unit 200. In detail, the second joint 323 moves along an arc-shaped trajectory at a distance R1 from the first joint 321.

In an exemplary embodiment, for example, when a length of the first main actuator 230 of the main driving unit 200 decreases, the second joint 323 moves along the arc-shaped trajectory in a clockwise direction. Conversely, when the length of the first main actuator 230 of the main driving unit 200 increases, the second joint 323 moves along the arc-shaped trajectory in a counterclockwise direction.

Referring to FIG. 4C, for the main driving unit 200 hinge-connected to the second auxiliary driving assembly 400, the fifth joint 423 moves about the fourth joint 421 as a pivot based on the driving of the second main actuator 250 of the main driving unit 200. In detail, the fifth joint 423 moves along an arc-shaped trajectory at a distance R2 from the fourth joint 421.

In an exemplary embodiment, for example, when a length of the second main actuator 250 of the main driving unit 200 decreases, the fifth joint 423 moves along the arc-shaped trajectory in a counterclockwise direction. Conversely, when the length of the second main actuator 250 of the main driving unit 200 increases, the fifth joint 423 moves along the arc-shaped trajectory in a clockwise direction.

Figure 5A:
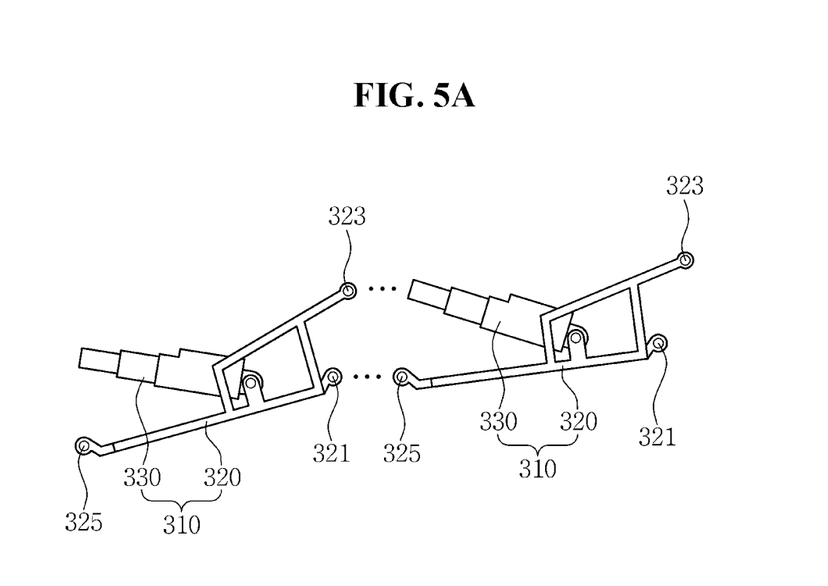
FIG. 5A is a view illustrating an exemplary embodiment of a connection mechanism between first auxiliary driving units of FIG. 3.
Figure 5B:
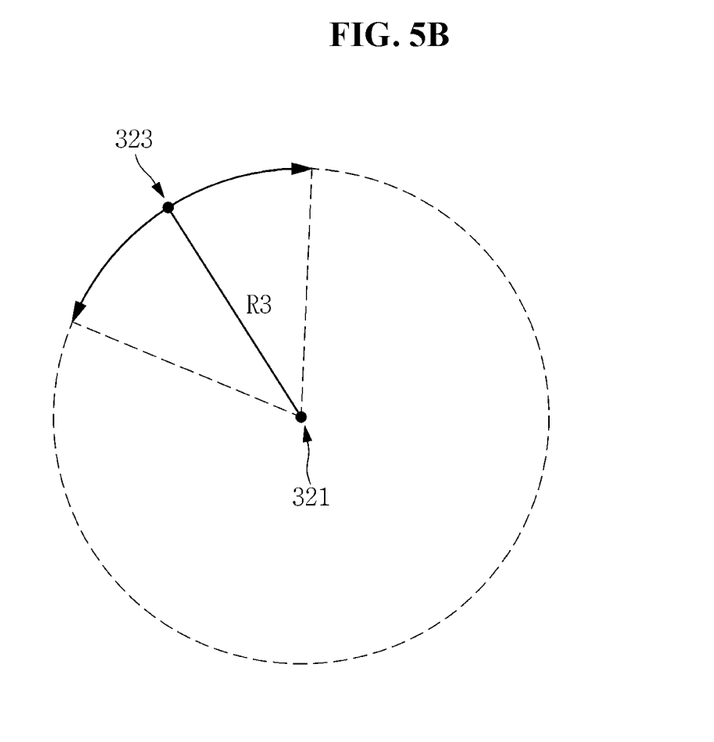
FIG. 5B is a view illustrating an exemplary embodiment of a movement of a second joint in the connection mechanism of FIG. 5A.

FIG. 5A is a view illustrating a connection mechanism between first auxiliary driving units 310 of FIG. 3. FIG. 5B is a view illustrating a movement of the second joint 323 of FIG. 5A.

Referring to FIG. 5A, among the plurality of first link portions 320 of FIG. 3, a first joint 321 of one first link portion 320 is hinge-connected to a third joint 325 of another (adjacent) first link portion 320. In addition, a second joint 323 of the one first link portion 320 is hinge-connected to a first auxiliary actuator 330 of the adjacent first link portion 320.

Referring to FIG. 5B, for adjacent first auxiliary driving units 310 connected to each other, the second joint 323 of the one first auxiliary driving unit 310 moves about the first joint 321 thereof as a pivot based on the driving of the first auxiliary actuator 330 of the adjacent first auxiliary driving unit 310. In detail, the second joint 323 of the one first auxiliary driving unit 310 moves along an arc-shaped trajectory at a distance R3 from the first joint 321.

For example, when a length of the first auxiliary actuator 330 of the adjacent first auxiliary driving unit 310 decreases, the second joint 323 of the one first auxiliary driving unit 310 moves along an arc-shaped trajectory in a clockwise direction. Conversely, when the length of the first auxiliary actuator 330 of the adjacent first auxiliary driving unit 310 increases, the second joint 323 of the one first auxiliary driving unit 310 moves along an arc-shaped trajectory in a counterclockwise direction.

Figure 6A:
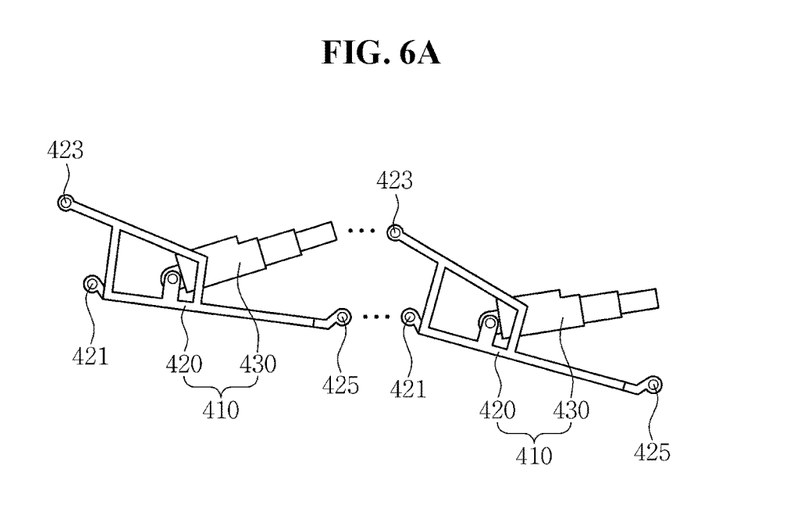
FIG. 6A is a view illustrating an exemplary embodiment of a connection mechanism between second auxiliary driving units of FIG. 3.
Figure 6B:
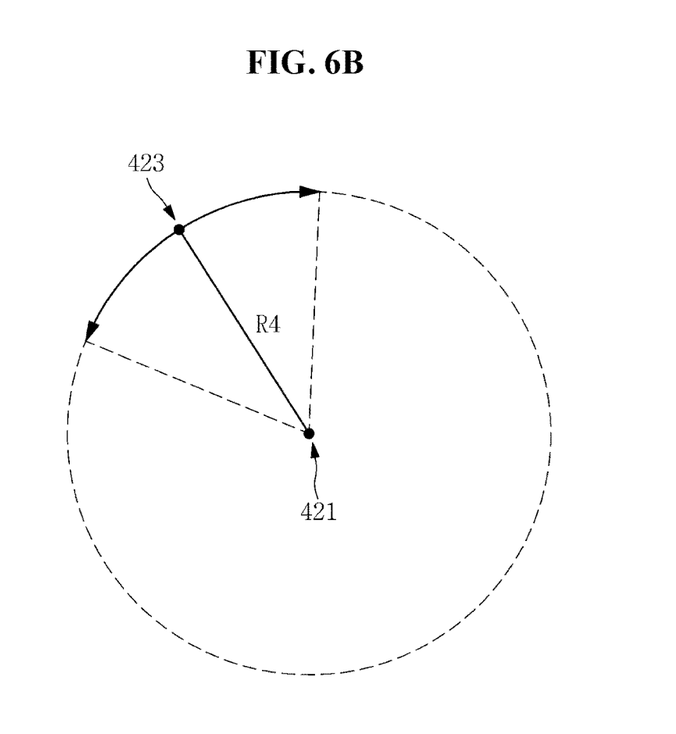
FIG. 6B is a view illustrating an exemplary embodiment of a movement of a fifth joint in the connection mechanism of FIG. 6A.

FIG. 6A is a view illustrating a connection mechanism between second auxiliary driving units 410 of FIG. 3. FIG. 6B is a view illustrating a movement of the fifth joint 423 of FIG. 6A.

Referring to FIG. 6A, among the plurality of second link portions 420 of FIG. 3, a fourth joint 421 of one second link portion 420 is hinge-connected to a sixth joint 425 of another (adjacent) second link portion 420. In addition, a fifth joint 423 of the one second link portion 420 is hinge-connected to a second auxiliary actuator 430 of the adjacent second link portion 420.

Referring to FIG. 6B, for adjacent second auxiliary driving units 410 connected to each other, the fifth joint 423 of the one second auxiliary driving unit 410 moves about the fourth joint 421 thereof as a pivot based on the driving of the second auxiliary actuator 430 of the adjacent second auxiliary driving unit 410. In detail, the fifth joint 423 of the one second auxiliary driving unit 410 moves along an arc-shaped trajectory at a distance R4 from the fourth joint 421.

In the foregoing, the configuration of the display device 10 according to an exemplary embodiment has been described. Hereinafter, an operation of the display device 10 according to an exemplary embodiment will be described.

Figure 7:
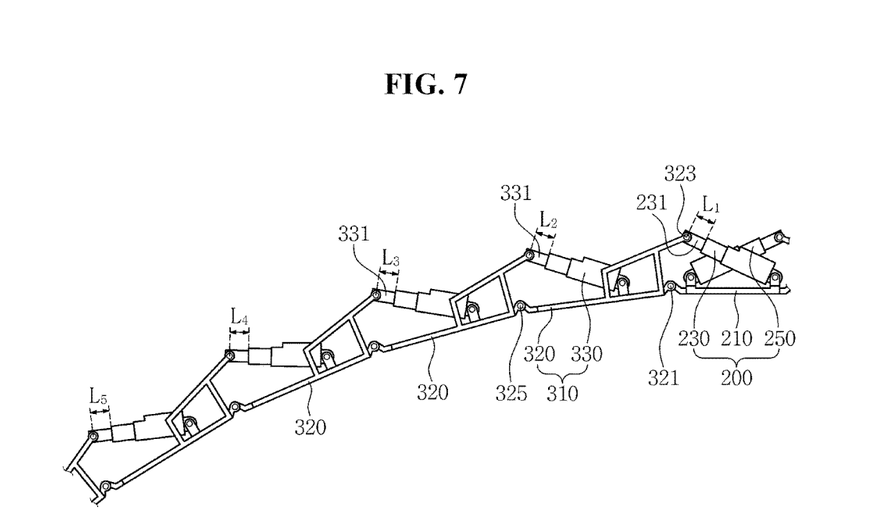
FIG. 7 is a view illustrating an exemplary embodiment of a portion of the first auxiliary driving assembly of FIG. 3.

FIG. 7 is a view illustrating an exemplary embodiment of a portion of the first auxiliary driving assembly 300 of FIG.

Figure 8:
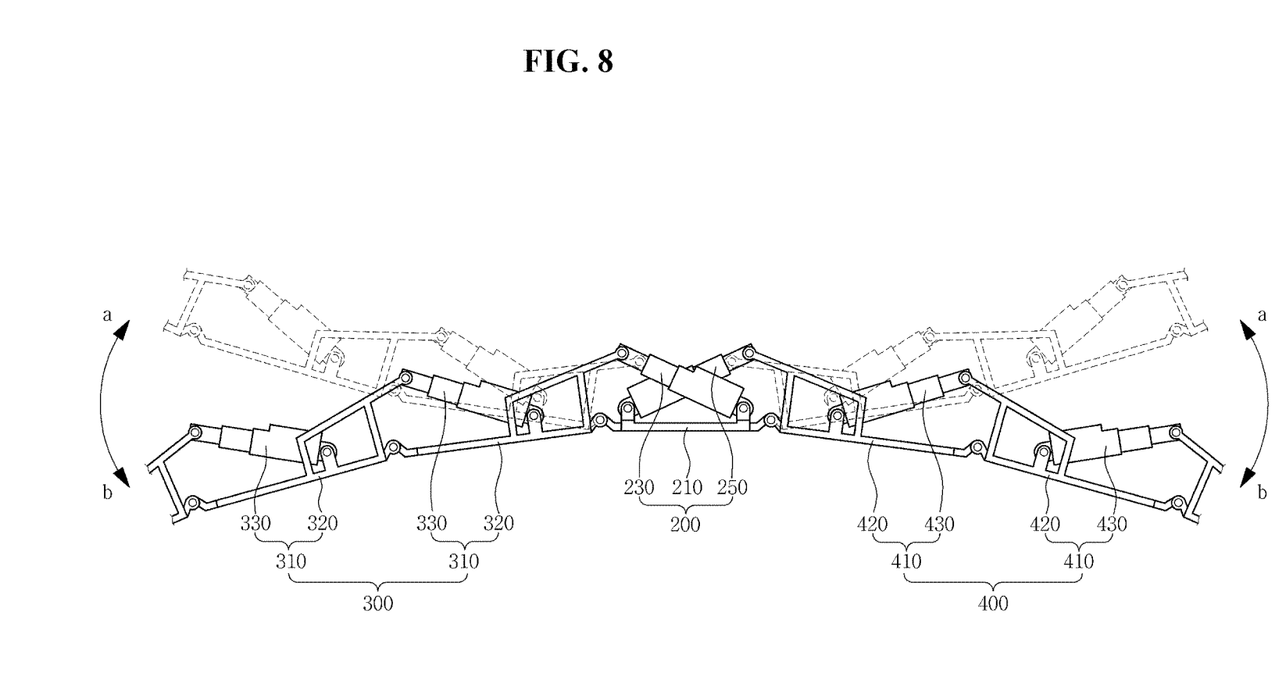
FIG. 8 is a view illustrating states of a display device from driving of the display device of FIG. 1.

3. FIG. 8 is a view illustrating states of a display device from driving the display device of FIG. 1.

Referring to FIG. 7, the first main actuator 230 includes a first main rod 231, and the first auxiliary actuator 330 includes a first auxiliary rod 331.

The first main rod 231 is movable within the first main actuator 230. When the first main actuator 230 is driven, the first main rod 231 moves within the first main actuator 230. In an exemplary embodiment of the first main rod 231 moving, for example, the first main rod 231 advances in a direction in which a length of the first main actuator 230 increases, or retracts in a direction in which the length of the first main actuator 230 decreases. In such an embodiment, where a first auxiliary driving unit 310 is connected to the main driving unit 200, the first auxiliary rod 331 of the first auxiliary driving unit 310 moves based on a direction in which the length of the first auxiliary actuator 330 of the main driving unit 200 increases or decreases.

The first main actuator 230 of the main driving unit 200 and the plurality of first auxiliary actuators 330 among the plurality of first auxiliary driving units 310 connected to the main driving unit 200 are independently driven from one another. In other words, since the first main actuator 230 and the first auxiliary actuators 330 may be independently driven, a driving distance L1 of the first main actuator 230 and respective driving distances L2 to L5 of the plurality of first auxiliary actuators 331 may be the same as or differ from one another.

By independently adjusting the respective driving distances L1 to L5 of the first main actuator 230 and the plurality of first auxiliary actuators 330, the display module 100 may have various curvatures. The operation of the first auxiliary driving assembly 300 has been described hereinabove, and the second auxiliary driving assembly 400 may be driven in the same manner as that of the first auxiliary driving assembly 300.

Referring to FIG. 8, among the actuators of the display device 10, the first and second main actuators 230 and 250, the plurality of first auxiliary actuators 330, and the plurality of second auxiliary actuators 430 may be independently driven from one another, and thus, various curvatures of the display module 100 and/or the display device 10 may be formed.

In an exemplary embodiment, the first auxiliary driving assembly 300 and the second auxiliary driving assembly 400 may each be driven in a "b" direction as indicated by the arrow in FIG. 8 with respect to the main driving unit 200 to define a center of curvature of the display module 100 at a viewing side of the display device 10 (e.g. lower portion in FIG. 8). Conversely, where each of the first auxiliary driving assembly 300 and the second auxiliary driving assembly 400 are driven in an "a" direction as indicated by the arrow in FIG. 8, the center of the curvature of display module 100 is different from that described above. For the "a" direction, the center of curvature of the display module 100 is defined at a rear side of the display device 10 (e.g. upper portion in FIG. 8).

In an alternative exemplary embodiment, the first auxiliary driving assembly 300 may be driven in the "a" direction and the second auxiliary driving assembly 400 may be driven in the "b" direction. For the display device 10 driven in both the "a" and "b" directions at the same time, more than one center of curvature of the display module 100 may be defined.

The first auxiliary driving unit 310 and the second auxiliary driving unit 410 may be independently driven from one another. In such an embodiment, the display module 100 may have various curvatures based on the position of the first auxiliary driving unit 310 and the second auxiliary driving unit 410 with respect to the main driving unit 200.

As set forth above, one or more exemplary embodiments of the display device may include the main driving unit disposed on a side of the display module, the first auxiliary driving assembly disposed at a side of the main driving unit, and the second auxiliary driving assembly disposed at an opposing side of the main driving unit.

The first auxiliary driving assembly includes a first auxiliary driving unit provided in plural arranged in a row in a first direction from the main driving unit. In addition, the second auxiliary driving assembly includes a second auxiliary driving unit provided in plural arranged in a row in a second direction opposite to the first direction from the main driving unit.

In such embodiments, the main driving unit, the first auxiliary driving unit and the second auxiliary driving unit may be independently driven from one another. Accordingly, the display module may have various curvatures based on the position of the main driving unit and the first and second auxiliary driving units with respect to each other.

From the foregoing, it will be appreciated that various exemplary embodiments in accordance with the present disclosure have been described herein for purposes of illustration, and that various modifications may be made without departing from the scope and spirit of the present teachings. Accordingly, the various exemplary embodiments disclosed herein are not intended to be limiting of the true scope and spirit of the present teachings. Various features of the above described and other embodiments can be mixed and matched in any manner, to produce further embodiments consistent with the invention.

What is claimed is:
1. A display device comprising:
a display module comprising a display panel which displays an image;
a main driving unit on a side of the display module, the main driving unit comprising:
a fixing bracket attached to the side of the display module;
a first main actuator hinge-connected to a first side of the fixing bracket; and
a second main actuator hinge-connected to a second side of the fixing bracket opposite to the first side;
a first auxiliary driving assembly hinge-connected to the first main actuator and the second side of the fixing bracket; and
a second auxiliary driving assembly hinge-connected to the second main actuator and the first side of the fixing bracket,
wherein
the first auxiliary driving assembly comprises a first auxiliary driving unit which comprises a first link portion defining a plurality of joints spaced apart from one another and a first auxiliary actuator hinge-connected to the first link portion,
the second auxiliary driving assembly comprises a second auxiliary driving unit which comprises a second link portion defining a plurality of joints spaced apart from one another and a second auxiliary actuator hinge-connected to the second link portion, and
the first main actuator, the second main actuator, the first auxiliary actuator and the second auxiliary actuator are drivable independent from one another.

2. The display device of claim 1, wherein
the first auxiliary driving assembly is fixed to the side of the display module and comprises the first auxiliary driving unit provided in plural arranged in a row in a first direction from the main driving unit, the plurality of the first auxiliary driving units being hinge-connected to each other, and
the second auxiliary driving assembly is fixed to the side of the display module and comprises the second auxiliary driving unit provided in plural arranged in a row in a second direction from the main driving unit opposite to the first direction, the plurality of the second auxiliary driving units being hinge-connected to each other.

3. The display device of claim 2, wherein the first link portion defines first, second and third joints spaced apart from one another.

4. The display device of claim 3, wherein for a hinge-connetion between the first auxiliary driving assembly and the main driving unit,
the fixing bracket of the main driving unit is connected to the first joint of the first auxiliary driving unit, and
the first main actuator of the main driving unit is connected to the second joint of the first auxiliary driving unit.

5. The display device of claim 4, wherein the second joint of the first auxiliary driving unit pivotably moves about the first joint based on a driving state of the first main actuator of the main driving unit.

6. The display device of claim 5, wherein the second joint of the first auxiliary driving unit pivotably moves along an arc-shaped trajectory defined about the first joint of the first auxiliary driving unit.

7. The display device of claim 6, wherein the second link portion defines fourth, fifth and sixth joints spaced apart from one another.

8. The display device of claim 7, wherein for a hinge-connection between the second auxiliary driving assembly and the main driving unit,
the fixing bracket of the main driving unit is connected to the fourth joint of the second auxiliary driving unit, and
the second main actuator of the main driving unit is connected to the fifth joint of the second auxiliary driving unit.

9. The display device of claim 8, wherein the fifth joint of the second auxiliary driving unit pivotably moves about the fourth joint based on a driving state of the second main actuator of the main driving unit.

10. The display device of claim 9, wherein the fifth joint of the second auxiliary driving unit moves along an arc-shaped trajectory defined about the fourth joint of the second auxiliary driving unit.

11. The display device of claim 10, wherein
one first auxiliary driving unit among the plurality of the first auxiliary driving units is adjacent to another first auxiliary driving unit among the plurality of the first auxiliary driving units, the one first auxiliary driving unit and the another first auxiliary driving unit being hinge-connected to each other,
the first joint of the one first auxiliary driving unit is connected to the third joint of the other first auxiliary driving unit, and
the second joint of the one first auxiliary driving unit is connected to the first auxiliary actuator of the another first auxiliary driving unit.

12. The display device of claim 11, wherein the second joint of the one first auxiliary driving unit pivotably moves along an arc-shaped trajectory about the first joint thereof based on a driving state of the first auxiliary actuator of the other first auxiliary driving unit.

13. The display device of claim 12, wherein
one second auxiliary driving unit among the plurality of the second auxiliary driving units is adjacent to another second auxiliary driving unit among the plurality of the second auxiliary driving units, the one second auxiliary driving unit and the another second auxiliary driving unit being hinge-connected to each other,
the fourth joint of the one second auxiliary driving unit is connected to the sixth joint of the other second auxiliary driving unit, and
the fifth joint of the one second auxiliary driving unit is connected to the second auxiliary actuator of the another second auxiliary driving unit.

14. The display device of claim 13, wherein the fifth joint of the one second auxiliary driving unit moves along an arc-shaped trajectory about the fourth joint based on a driving state of the second auxiliary actuator of the another second auxiliary driving unit as a pivot.

15. The display device of claim 14, wherein the first main actuator and the second main actuator intersect one another.

16. The display device of claim 15, wherein the first link portion of the first auxiliary driving unit and the second link portion of the second auxiliary driving unit are fixed to the display module by an adhesive member.

17. The display device of claim 16, wherein the adhesive member is an elastomer.

18. The display device of claim 17, wherein the adhesive member is one selected from a styrene-based polymer, a polyurethane-based polymer, an amide-based polymer, a polyethylene terephthalate-based polymer, and a combination thereof.

19. A method of curving a display device, comprising:
respectively hinge-connecting a first auxiliary driving assembly and a second auxiliary driving assembly to a main driving unit at opposing sides thereof, the main driving unit comprising:
a fixing bracket attached to a display module comprising a display panel which displays an image;
a first main actuator hinge-connected to a first side of the fixing bracket and to the first auxiliary driving assembly; and
a second main actuator hinge-connected to a second side of the fixing bracket opposite to the first side thereof and to the second auxiliary driving assembly;
respectively attaching the hinge-connected first auxiliary driving assembly, second auxiliary driving assembly and main driving unit directly to first, second and main portions of a same side of the display module comprising the display panel which displays the image; and
with the first auxiliary driving assembly, the second auxiliary driving assembly and the main driving unit respectively hinge-connected to each other and attached to the first, second and main portions of the display module, independently actuating the first and second main actuators of the main driving unit, and the first auxiliary driving assembly and the second auxiliary driving assembly respectively hinge-connected thereto, to change locations of the first and second portions of the display module with respect to the main portion thereof.

* * * * *